United States Patent
Gregory et al.

(10) Patent No.: US 12,051,637 B1
(45) Date of Patent: Jul. 30, 2024

(54) DIRECT TO CHIP APPLICATION OF BOILING ENHANCEMENT COATING

(71) Applicant: MTS IP Holdings Ltd, Grand Cayman (KY)

(72) Inventors: Luke Gregory, Mercer Island, WA (US); Jimil Shah, Wylie, TX (US); Ethan Schmitz, Saint Paul, MN (US); Richard Eiland, Austin, TX (US); Ioannis Manousakis, Zürich (CH)

(73) Assignee: MTS IP Holdings Ltd, Grand Cayman (KY)

( * ) Notice: Subject to any disclaimer, the term of this patent is extended or adjusted under 35 U.S.C. 154(b) by 0 days.

(21) Appl. No.: 18/460,091

(22) Filed: Sep. 1, 2023

Related U.S. Application Data

(63) Continuation of application No. PCT/US2023/069853, filed on Jul. 10, 2023.

(51) Int. Cl.
*H01L 23/373* (2006.01)
*H01L 23/02* (2006.01)
*H01L 23/31* (2006.01)

(52) U.S. Cl.
CPC .......... *H01L 23/3735* (2013.01); *H01L 23/02* (2013.01); *H01L 23/3107* (2013.01); *H01L 23/3731* (2013.01); *H01L 23/3736* (2013.01)

(58) Field of Classification Search
CPC . H01L 23/3735; H01L 23/02; H01L 23/3107; H01L 23/3731; H01L 23/3736
See application file for complete search history.

(56) References Cited

U.S. PATENT DOCUMENTS

| | | |
|---|---|---|
| 5,814,392 A | 9/1998 | You et al. |
| 7,135,769 B2 | 11/2006 | Ni et al. |
| 2004/0190254 A1 | 9/2004 | Hu et al. |
| 2006/0090881 A1 | 5/2006 | Tuma |
| 2009/0212418 A1 | 8/2009 | Gurrum et al. |
| 2011/0127013 A1* | 6/2011 | Kawamura ........... H01L 23/427 |
| | | 29/890.032 |
| 2013/0004769 A1 | 1/2013 | Okamoto et al. |
| 2017/0076960 A1 | 3/2017 | Chen et al. |
| 2017/0287805 A1 | 10/2017 | Ozawa et al. |
| 2019/0393118 A1 | 12/2019 | Rawlings et al. |
| 2022/0187023 A1* | 6/2022 | Kang ...................... F28D 15/02 |
| 2022/0201889 A1* | 6/2022 | Sover ...................... H01L 23/44 |
| 2022/0270949 A1 | 8/2022 | Yeh et al. |
| 2022/0406675 A1 | 12/2022 | Lee et al. |

(Continued)

FOREIGN PATENT DOCUMENTS

EP    2251903 A1    11/2010

OTHER PUBLICATIONS

Boyd Solutions thermal management Two-phase-cooling technologies datasheet, from Boyd Solutions website, Feb. 4, 2022, 2 pages.

(Continued)

*Primary Examiner* — Peniel M Gumedzoe
(74) *Attorney, Agent, or Firm* — Smith Baluch LLP

(57) ABSTRACT

Methods to form a boiling enhancement coating (BEC) directly on a protective lid or directly on a semiconductor die are described. The BEC can improve heat dissipation from the protective lid or semiconductor die into a coolant liquid of a two-phase immersion-cooling system. In some cases, a heat spreader is not needed to cool the semiconductor die.

24 Claims, 5 Drawing Sheets

(56) References Cited

U.S. PATENT DOCUMENTS

2023/0180434 A1* 6/2023 Shia ................ H05K 7/20381
361/700

OTHER PUBLICATIONS

International Search Report and Written Opinion in International App. No. PCT/US2023/069853 dated Dec. 12, 2023, 19 pages.
International Search Report in International App. No. PCT/US2023/067058 mailed Dec. 19, 2023, 21 pages.

* cited by examiner

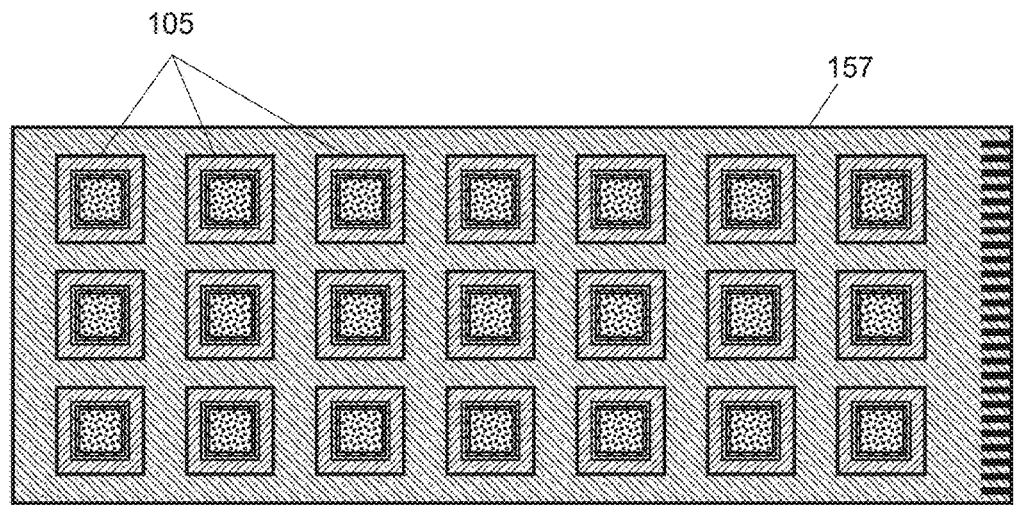
FIG. 1B
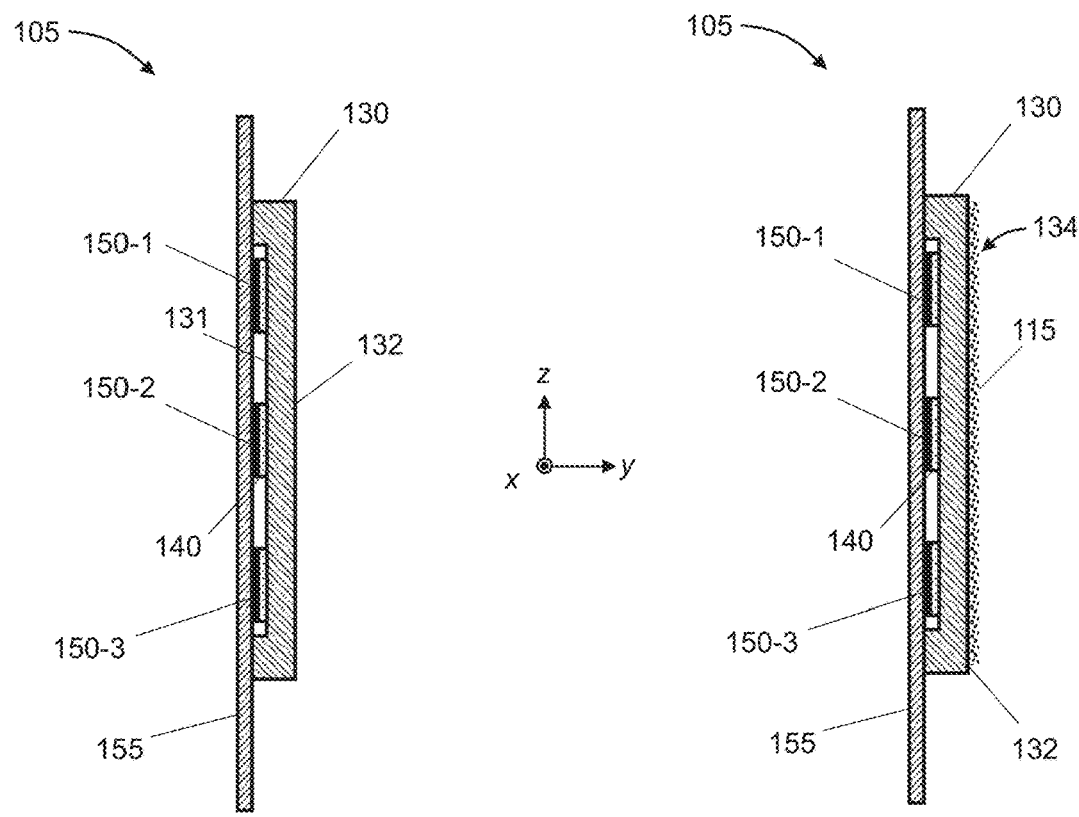
FIG. 2A
FIG. 2B

DIRECT TO CHIP APPLICATION OF BOILING ENHANCEMENT COATING

CROSS-REFERENCE TO RELATED APPLICATIONS

The present application is a bypass continuation of international patent application No. PCT/US2023/069853, titled "DIRECT TO CHIP APPLICATION OF BOILING ENHANCEMENT COATING," and filed Jul. 10, 2023, which is incorporated herein by reference in its entirety.

BACKGROUND

As feature sizes and transistor sizes have decreased for integrated circuits (ICs), the amount of heat generated by a single chip, such as a microprocessor, has increased. Chips that once were air cooled have evolved to chips needing more heat dissipation than can be provided by air alone. In some cases, immersion cooling of chips in a tank containing a coolant liquid is employed to maintain IC chips at appropriate operating temperatures.

One type of immersion cooling is two-phase immersion cooling, in which heat from a semiconductor die is high enough to boil the coolant liquid. The boiling creates a coolant-liquid vapor in the tank, which is condensed by cooling coils back to liquid form. Heat from the semiconductor dies can then be sunk into the liquid-to-gas and gas-to-liquid phase transitions of the coolant liquid.

SUMMARY

The present disclosure relates to applying a boiling enhancement coating (BEC) directly to a chip or package that includes a chip. The BEC forms a roughened surface on the chip or package that enhances nucleate boiling of the coolant liquid in a two-phase immersion-cooling system compared to the chip or package without the BEC. The BEC can be applied in any number of different ways including, but not limited to, spraying, painting, electro-static deposition, soldering, adhesion, via tape, or a reflow process.

Some implementations relate to methods of applying a BEC to a surface of a protective lid. An example method includes an act of applying a boiling enhancement coating to a surface of a protective lid. The protective lid can be configured to thermally couple to at least one semiconductor die with a thermal interface material, and the thermal interface material is arranged to contact the protective lid and the at least one semiconductor die.

Some implementations relate to a protective lid to cool at least one semiconductor die. The protective lid comprises: a first surface to contact a thermal interface material that contacts the at least one semiconductor die; a second surface on side of the protective lid that is opposite the first surface; and a boiling enhancement coating disposed on the second surface.

Some implementations relate to applying a boiling enhancement coating to a surface of a semiconductor die.

Some implementations relate to a semiconductor die adapted for increased heat dissipation. The semiconductor die comprises: a surface to expose to a coolant liquid; and a boiling enhancement coating disposed on the surface.

All combinations of the foregoing concepts and additional concepts discussed in greater detail below (provided such concepts are not mutually inconsistent) are part of the inventive subject matter disclosed herein. In particular, all combinations of subject matter appearing in this disclosure are part of the inventive subject matter disclosed herein. The terminology used herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally and/or structurally similar elements).

FIG. 1B depicts a plurality of packaged semiconductor dies mounted on a printed circuit board suitable for use in the immersion-cooling system of FIG. 1A.

FIG. 2A depicts a lidded semiconductor die in a package.

FIG. 2B depicts a boiling enhancement coating (BEC) applied to a protective lid.

DETAILED DESCRIPTION

Figure 1A:
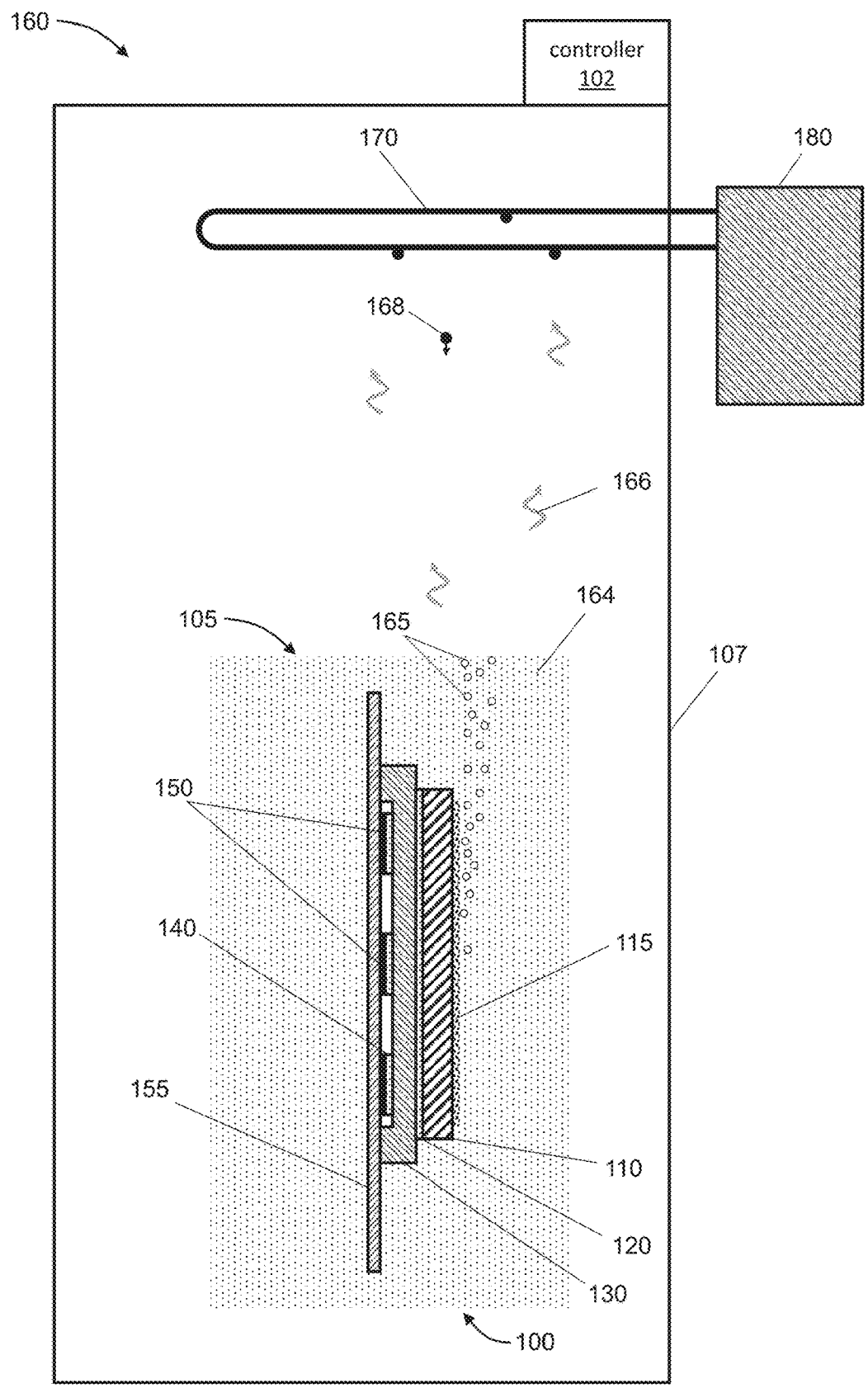
FIG. 1A depicts an example of a two-phase immersion-cooling system that can be used to cool semiconductor dies as described herein.

FIG. 1A depicts aspects of an immersion-cooling system 160 and a cooling assembly 100 for dissipating heat from one or more semiconductor dies 150 via immersion cooling (such as two-phase or single-phase immersion cooling). The illustrated example is not to scale and depicts the cooling assembly 100 much larger in the immersion-cooling system than it would be in an actual implementation. Typically, the two-phase immersion-cooling system 160 is much larger than the cooling assembly 100. For example, the immersion-cooling system 160 may house and provide coolant liquid 164 to tens, hundreds, or even thousands of cooling assemblies 100. The cooling assemblies 100 can be mounted on one or more printed circuit boards (PCBs) that are installed within a tank 107 of the immersion-cooling system 160.

The cooling assembly 100 can include a heat spreader 110 (which may be referred to as a "boiler plate" or "heat-dissipative element" in some applications) that may thermally couple to a protective lid 130 with a first thermal interface material (TIM) 120, according to some implementations. The protective lid 130 (if present) can thermally couple to the semiconductor die(s) 150 with a second TIM 140. In some implementations, the heat spreader 110 can thermally couple directly to the semiconductor die(s) 150, as described in U.S. provisional patent application Ser. No. 63/500,167 titled "Direct to Chip Heat Spreader and Boiler Enhancement Coatings for Microelectronics," filed May 4, 2023, and in international patent application PCT/US2023/ 67058 titled "Electronic Package Construction for Immersion Cooling of Integrated Circuits," filed May 16, 2023, both of which applications are herein incorporated by reference in their entirety.

The semiconductor die(s) 150 and protective lid(s) 130 (if present) can be mounted together on, and attach to, a printed circuit board (PCB) 155 (sometimes called a "substrate") in a device package 105 that can be made commercially available. A plurality of the device packages 105 can be populated onto a larger printed circuit board 157, as depicted in FIG. 1B. A plurality of the larger printed circuit boards 157 can be installed within the tank 107 of the immersion-cooling system 160 and cooled by the coolant liquid 164 during operation.

The cooling assembly 100 of FIG. 1A can be used for two-phase immersion cooling of at least one semiconductor die 150, such as a microprocessor (e.g., a central processing unit (CPU) and/or graphic processing unit (GPU)), voltage regulator (VR), high bandwidth memory (HBM), a digital signal processing (DSP) die, an application-specific integrated circuit (ASIC), field-programmable gate array (FPGA), and/or other densely patterned semiconductor die.

In a two-phase immersion-cooling system 160, heat flows from the semiconductor die 150 where it is generated, through the second TIM 140 (if present) into the protective lid 130 (if present), through the first TIM 120, and into the heat spreader 110. The heat spreader 110 is in thermal contact with a coolant liquid 164 that can flow over and extract heat from the heat spreader 110. The amount of heat delivered by the heat spreader 110 to the coolant liquid 164 is enough to boil the coolant liquid 164 that contacts the heat spreader 110 (creating bubbles 165). The vapor 166 from the boiled coolant liquid 164 can be cooled and condensed back to liquid droplets 168, for example, by a condenser coil 170. A heat transfer fluid, such as chilled water, from a chiller 180 can be circulated through the condenser coil 170 to condense the vapor 166 on exterior surfaces of the condenser coil 170. Liquid droplets 168 from the condensed vapor can drip and/or flow back to the coolant liquid 164 that contacts the heat spreader 110. Certain aspects of the two-phase immersion-cooling system 160 can be controlled by a controller 102, which may monitor temperatures at different points in the system and take corrective actions if overtemperatures are detected.

To improve thermal performance in two-phase immersion-cooling system 160, the heat spreader 110 can include a boiling enhancement coating (BEC) 115 on at least one surface. The BEC 115 can be formed from copper or a copper alloy and can be porous, for example, though BECs can take various forms. In some cases, the BEC is a micro porous copper coating having a thickness from approximately or exactly 50 microns to 500 microns thick (which may be produced by electroplating and/or etching). In some implementations, the BEC 115 comprises a mesh copper layer bonded (e.g., via resistance heating) to at least a top surface of the heat spreader 110. In some cases, the BEC 115 is applied as particulates to at least one smooth surface of the heat spreader 110 and then subsequently sintered to bond to one another and to the heat spreader 110. The BEC 115 provides a large surface area to contact the coolant liquid 164 and can increase the heat transfer coefficient from the heat spreader 110 to the coolant liquid 164 by up to a factor of 15 versus a smooth surface on the heat spreader 110. Accordingly, BECs 115 can increase thermal conductivity to, and accelerate the boiling of, the coolant liquid 164.

The inventors have recognized and appreciated that a BEC can be formed directly on the protective lid 130 of a package 105 or even on the semiconductor die(s) 150 of a package 105 if a protective lid 130 is not used. As such, thermal dissipation of heat from the semiconductor die(s) 150 can be adequate during operation without the heat spreader 110, in some cases. In yet further implementations, thermal dissipation of heat from the semiconductor die(s) 150 can be adequate during operation without the heat spreader 110 and without the protective lid 130.

FIG. 2A depicts the package 105 of FIG. 1A that includes three semiconductor dies 150-1, 150-2, 150-3 and the protective lid 130. In implementations, the semiconductor dies can be the same or can be different. For example, the semiconductor dies 150 can all be voltage regulators or high bandwidth memory (HBM) chips. In another example, one of the semiconductor dies 150-1 can be a GPU and another 150-3 can be an HBM chip. The protective lid 130 is normally formed from a metal (e.g., aluminum, an aluminum alloy, copper, a copper alloy, or some combination thereof). A first surface 131 of the protective lid 130 can be arranged to thermally couple to one or more semiconductor dies 150-1, 150-2, 150-3. For example, the first surface 131 can be flat and arranged to contact the TIM 140 which in turn contacts the semiconductor die(s) 150.

Typically, an outer surface 132 (or second surface) of the protective lid 130 is flat and smooth. The outer surface 132 extends in a plane that is parallel to the xy plane in the drawing of FIG. 2A and is on a side of the protective lid opposite the first surface 131. Normally, the outer surface 132 is smooth so that it can be easily thermally coupled to a heat spreader 110 (shown in FIG. 1A). For example, a thermal interface material (TIM 120, such as a thermal epoxy) can be applied to the smooth outer surface 132 and a flat, smooth surface of the heat spreader can be pressed against the thermal interface material to provide good thermal coupling between the heat spreader 110 and protective lid 130. The heat spreader 110 can include a BEC 115.

Figure 2C:
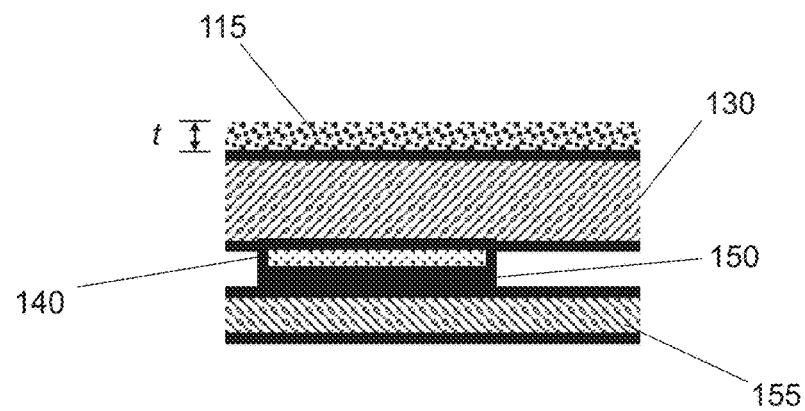
FIG. 2C depicts further details of the BEC of FIG. 2B.

Instead of applying a TIM 120 and heat spreader 110, a BEC 115 can be applied directly to the protective lid 130, according to some implementations. The resulting structure is shown in FIG. 2B. At least one semiconductor die 1150-1, 150-2, 150-3 and the protective lid 130 are mounted together on a printed circuit board 155 in a package 105, which could be provided as an off-the-shelf package. The BEC 115 is disposed on the outer surface 132 of the protective lid 130 and forms a rough surface 134 immediately adjacent to the outer surface 132 of the protective lid 130. The protective lid 130 has a first surface 131 to contact a thermal interface material 140 that contacts the at least one semiconductor die 150-1, for example. The protective lid further includes a second surface (outer surface 132) on side of the protective lid that is opposite the first surface 131. An enlarged portion of the package 105 of FIG. 2B is shown in FIG. 2C, rotated counterclockwise by 90 degrees.

The BEC 115 can comprise at least one layer of a metallic mesh (e.g., a woven mesh of thin metallic wires), a metallic wool (e.g., randomly oriented and interwoven strands of metallic wires), particles (e.g., metallic, carbon, semiconductor, silica, and/or ceramic particles), an adhesive (e.g., a thermally-conductive adhesive, an acrylic adhesive, or solder), or some combination thereof. A thickness t of the BEC can be from approximately or exactly 50 microns to approximately or exactly 2 millimeters (mm), though thinner or thicker BECs can be used in some implementations. Metals used for the BEC 115 can include aluminum, an aluminum alloy, copper, a copper alloy, or some combination thereof. Particle sizes can be in a range from approximately or exactly 0.5 micron in size (e.g., a maximum diameter measured for a particle) to approximately or exactly 1 mm in size, though smaller and/or larger sizes are also possible. The BEC 115 can be formed by an additive process (e.g., sintering, adhering, soldering, or otherwise bonding at least one mesh and/or a plurality of particles) or a subtractive process (e.g., etching, laser cutting, laser ablation, sanding, grinding, etc.) If more than one layer of mesh is used to form a BEC 115, the coarseness of the mesh layers can vary from a less coarse mesh layer (having smaller pore sizes) that is attached to the surface of the semiconductor die or chip, to a coarser mesh layer (having larger pore sizes) that is farther away from the surface (e.g., on a side of the finer mesh layer that is opposite to the side of the finer mesh layer that faces the semiconductor die or chip). The smaller pore size in the finer mesh layer can facilitate nucleation of bubbles and improve boiling of the coolant liquid 164.

There are several ways in which the BEC 115 can be applied to the protective lid 130. The mesh, wool, and/or particles can be bonded to the outer surface 132 of the protective lid using an adhesive (e.g., a thermally-conductive epoxy or solder). An example of a thermally-conductive epoxy is Appli-Thane® 7300, a thermally-conductive epoxy available from Appli-Tech, Inc. of Salem, New Hampshire. The adhesive may be used in several ways. In a first approach, the adhesive can be first coated onto the protective lid 130 by brush application, spray application, or dip coating. Then, the mesh, wool, and/or particles can be applied to the adhesive using any suitable method (e.g., press on for the mesh and wool, spray on or dip for the particles). In another approach, the adhesive can be applied to a surface of the mesh or wool first, and then the adhesive-coated surface can be contacted to the outer surface 132 of the protective lid 130. In yet another approach, the particles can be mixed into the adhesive to create a suspension of particles in the adhesive and the suspension can be brushed, sprayed, or dip-coated onto at least the outer surface 132.

Solder can also be used in several ways to attach the mesh, wool, or particles to the outer surface of the protective lid 130. In a first approach, a thin coating of solder can be applied to the outer surface 132. The mesh, wool, and/or particles can then be placed on the soldered surface. The conglomeration can then be heated to reflow the solder and bond the mesh, wool, and/or particles to the outer surface. In another approach, the mesh, wool, and/or particles can be coated with solder (or may themselves comprise wires or particles of solder) and be placed on the outer surface 132. A reflow process (by heating the protective lid) can then be performed to bond the mesh, wool, and/or particles to the outer surface 132.

Other ways to bond the mesh, wool, and/or particles to the outer surface 132 of the protective lid include sintering, electrostatic deposition, and application by a thermally-conductive tape. Examples of thermally-conductive tape includes the 3M™ Thermally Conductive Interface Tape 8926 series of tapes. The tape can be double-side adhesive so that the tape can bond to the outer surface 132 on one side and to the mesh, wool, and/or particles on the other side.

Figure 3A:
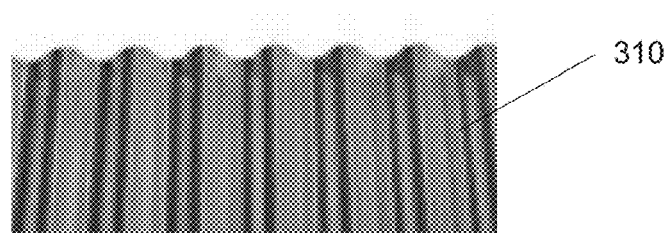
FIG. 3A depicts a corrugated surface of a protective lid.
Figure 3B:
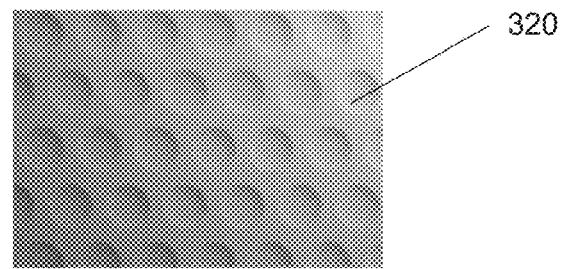
FIG. 3B depicts a dimpled surface of a protective lid.

It should be appreciated that the above methods of applying the mesh, wool, and/or particles to the outer surface 132 of the protective lid 130 do not require the outer surface to be flat and smooth. In some implementations, the outer surface 132 can have topography to increase its surface area. Such topography can include corrugations 310, shown in FIG. 3A and/or dimpling 320, shown in FIG. 3B. The dimpling can be negative (indents into the surface) or positive (bumps extending outward from the surface).

Figure 4A:
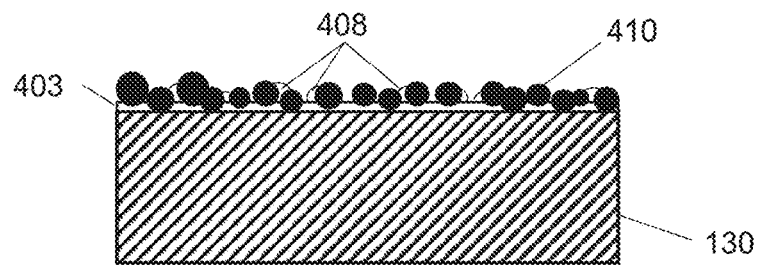
FIG. 4A depicts spherical particles bonded to a protective lid with an adhesive.

FIG. 4A depicts a portion of a package 105 where an adhesive 403 (such as an acrylic adhesive) is used to bond spherical particles 410 to the protective lid 130. The spherical particles 410 may be silica or a semiconductor. Some of the spherical particles 410 can be at least partially immersed in the adhesive 403 and contact the protective lid 130. The particles 410 can reduce the wetting angle of coolant liquid on the surface of the protective lid 130 and nucleate the formation of bubbles 408 to initiate boiling.

Figure 4B:
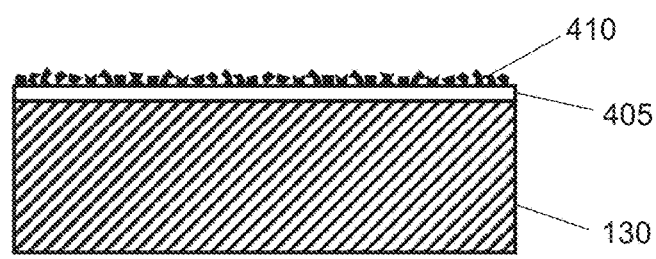
FIG. 4B depicts randomly-shaped particles bonded to a protective lid with tape.

FIG. 4B depicts a portion of a package 105 where thermally-conductive tape 405 is used to bond particles 410 to the protective lid 130. The thermally-conductive tape 405 may separate all particles 410 from the protective lid 130 by approximately the thickness of the tape 405 (which may be between 20 microns and 200 microns thick).

Figure 4C:
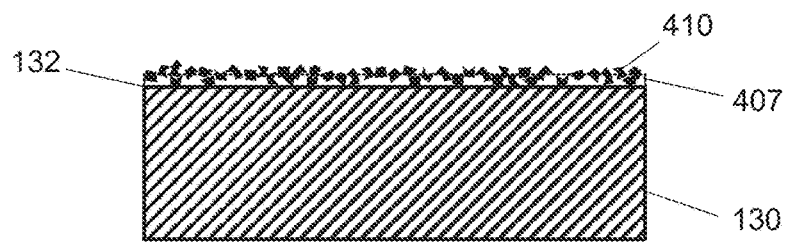
FIG. 4C depicts randomly-shaped particles bonded to a protective lid with an adhesive.

FIG. 4C depicts a portion of a package 105 where thermally-conductive epoxy 407 is used to bond particles 410 to the protective lid 130. In this case, some of the particles 410 can contact the outer surface 132 of the protective lid 130, which may improve heat dissipation from the lid since the thermal conductivity of the particles can be significantly higher than the thermal conductivity of the epoxy 407 and tape 405.

Figure 4D:
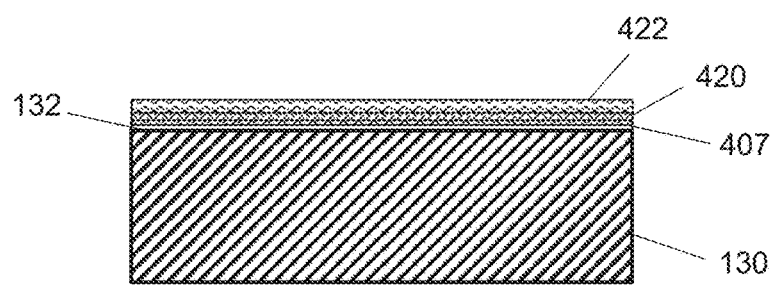
FIG. 4D depicts two mesh layers bonded to a protective lid.

FIG. 4D depicts a portion of a package 105 where thermally-conductive epoxy 407 is used to bond at least one mesh 420 (or a thermally-conductive wool in another implementation) to the protective lid 130. The mesh 420 (or wool) can be at least partially immersed in the thermally-conductive epoxy 407. At least a portion of the mesh 420 (or wool) can contact the outer surface 132 of the protective lid 130 to form a BEC comprising a layer of mesh 420 (or wool) and improve heat transfer and dissipation. In some implementations, a second layer of coarser mesh 422 can be bonded (with a second application of the thermally-conductive epoxy 407 that is not shown in FIG. 4D) to the first layer 420 of finer mesh 420.

Figure 4E:
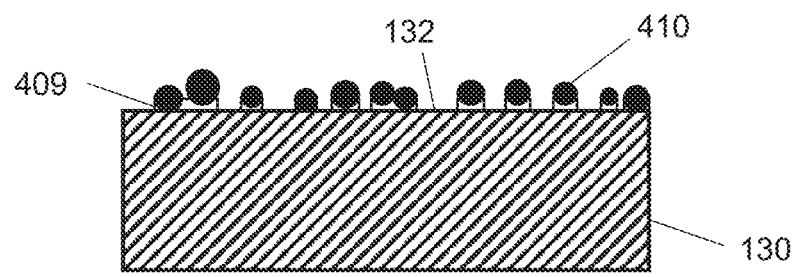
FIG. 4E depicts spherical particles bonded to a protective lid with an adhesive where an etching step has been performed to remove polymer from the protective lid in areas not covered by the particles.

According to some implementations, the outer surface 132 to which the BEC is applied can be exposed to an etch. For example, a dry anisotropic etch (e.g., an oxygen plasma reactive ion etch) can be performed after applying the BEC 115 to remove adhesive polymer 409 (of an adhesive or tape) from areas or regions of the underlying outer surface 132 that are not covered by particles 410 and/or wires in a mesh 420 or wool that form the BEC 115. This etch can expose portions of the outer surface 132 of the protective lid, as depicted in FIG. 4E, improving thermal conductivity to the coolant liquid. If the etch is slightly isotropic so that undercutting occurs, then the etch may also further roughen the surface in a way to improve nucleation and boiling. Adhesive polymer 409 remains under the particles or wires which serve as masks for the etch. Other components of the package 105 can be protected from the etch with a removable coating (such as a thick soluble polymer coating that can be washed off after the etch or a tape that can be removed).

Figure 5:
FIG. 5 depicts a BEC applied directly to a semiconductor die.

FIG. 5 depicts a portion of a package 105 and an example implementation where the protective lid 130 is not used. In this example, the BEC 115 (which can be some or all of the above-described BECs applied to a protective lid) is applied directly to an outer surface 532 of a semiconductor die 150 in the package 105. The outer surface 532 and its BEC 115 are arranged to be exposed to a coolant liquid when the package is placed in a tank 107 of an immersion-cooling system. Applying the BEC 115 directly to the semiconductor die 150 can increase the rate of heat dissipation from the semiconductor die 150 into the coolant liquid of an immersion-cooling system. Any of the approaches described above in connection with FIG. 2B, FIG. 2C, FIG. 4A, FIG. 4B, and FIG. 4C for applying the BEC 115 can be used to apply the BEC 115 directly to the semiconductor die(s) of a package 105 or before the semiconductor die(s) are packaged. Typically, a semiconductor die will have a flat and smooth outer surface, though microfabrication could by used to form corrugated and/or dimpled outer surfaces of the semiconductor dies. For the example implementation of FIG. 5, a thermally-conductive epoxy 407 is used to bond particles 410 to the outer surface of the semiconductor die 150.

When applying the BEC 115 to the protective lid 130 and/or to semiconductor die(s) 150 (both of which could be done in a same process for a same package), areas of the PCB 155 where the BEC will not be applied can be masked off with a shroud or removable coating or tape to prevent contamination of those areas. It is also possible to apply the BEC 115 to the protective lid 130 before the protective lid is placed in the package 105 and thermally coupled to the semiconductor die(s) 150.

The BECs 115, their application to protective lids and/or semiconductor dies, and related concepts described herein can be implemented in several ways, some examples of which are enumerated in the following list.

(1) A method comprising: applying a boiling enhancement coating to a surface of a protective lid, wherein the protective lid is configured to thermally couple to at least one semiconductor die with a thermal interface material, the thermal interface material contacting the protective lid and the at least one semiconductor die.

(2) The method of (1), wherein the protective lid and the at least one semiconductor die are mounted together on a printed circuit board in a package.

(3) The method of (1) or (2), wherein applying the boiling enhancement coating comprises: applying an adhesive to the surface; and applying particles to the adhesive.

(4) The method of (1) or (2), wherein applying the boiling enhancement coating comprises: mixing particles with an adhesive to create a suspension containing the particles; and applying the suspension to the surface.

(5) The method of any one of (1) through (4), further comprising: exposing the surface to an etch to remove the adhesive from regions of the surface not covered by the particles.

(6) The method of any one of (3) through (5), wherein the adhesive is an acrylic.

(7) The method of any one of (3) through (5), wherein the adhesive is a thermally-conductive epoxy.

(8) The method of any one of (3) through (3), wherein the adhesive is tape.

(9) The method of any one of (3) through (8), wherein the particles comprise silica.

(10) The method of any one of (3) through (8), wherein the particles comprise a semiconductor.

(11) The method of any one of (3) through (8), wherein the particles comprise a metal.

(12) The method of any one of (3) through (8), wherein the particles comprise a ceramic.

(13) The method of any one of (3) through (12), wherein a maximum diameter of the particles is in a range from 0.5 micron to 1 millimeter.

(14) The method of any one of (3) through (13), wherein the particles are spherical.

(15) The method of (1) or (2), wherein applying the boiling enhancement coating comprises: bonding a layer of metallic mesh or metallic wool to the surface.

(16) The method of (1) or (2), wherein applying the boiling enhancement coating comprises: bonding a first mesh layer to the surface; and bonding a second mesh layer to the first mesh layer, wherein the second mesh layer is coarser than the first mesh layer.

(17) A protective lid to cool at least one semiconductor die, the protective lid comprising: a first surface to contact a thermal interface material that contacts the at least one semiconductor die; a second surface on side of the protective lid that is opposite the first surface; and a boiling enhancement coating disposed on the second surface.

(18) The protective lid of configuration (17), mounted together with the at least one semiconductor die on a printed circuit board in a package.

(19) The protective lid of configuration (17) or (18), wherein the boiling enhancement coating comprises: an adhesive contacting the second surface; and particles bonded by the adhesive to the second surface.

(20) The protective lid of configuration (19), wherein the adhesive has been etched to remove the adhesive from regions of the second surface not covered by the particles.

(21) The protective lid of any one of configurations (19) or (20), wherein the adhesive is an acrylic.

(22) The protective lid of any one of configurations (19) through (20), wherein the adhesive is a thermally-conductive epoxy.

(23) The protective lid of any one of configurations (19) through (20), wherein the adhesive is tape.

(24) The protective lid of any one of configurations (19) through (23), wherein the particles comprise silica.

(25) The protective lid of any one of configurations (19) through (23), wherein the particles comprise a semiconductor.

(26) The protective lid of any one of configurations (19) through (23), wherein the particles comprise a metal.

(27) The protective lid of any one of configurations (19) through (23), wherein the particles comprise a ceramic.

(28) The protective lid of any one of configurations (19) through (27), wherein a maximum diameter of the particles is in a range from 0.5 micron to 1 millimeter.

(29) The protective lid of any one of configurations (19) through (28), wherein the particles are spherical.

(30) The protective lid of any one of configurations (17) or (18), wherein the boiling enhancement coating comprises a layer of metallic mesh or metallic wool bonded to the second surface.

(31) The protective lid of any one of configurations (17) or (18), wherein the boiling enhancement coating comprises: a first mesh layer bonded to the second surface; and a second mesh layer bonded to the first mesh layer, wherein the second mesh layer is coarser than the first mesh layer.

(32) A method comprising: applying a boiling enhancement coating to a surface of a semiconductor die.

(33) The method of (15), wherein the semiconductor die is mounted on a printed circuit board in a package.

(34) The method of (15) or (33), wherein applying the boiling enhancement coating comprises: applying an adhesive to the surface; and applying particles to the adhesive.

(35) The method of (15) or (33), wherein applying the boiling enhancement coating comprises: mixing particles with an adhesive to create a suspension containing the particles; and applying the suspension to the surface.

(36) The method of (34) or (17), further comprising: exposing the surface to an etch to remove the adhesive from regions of the surface not covered by the particles.

(37) The method of any one of (34) through (36), wherein the adhesive is an acrylic.

(38). The method of any one of (34) through (36), wherein the adhesive is a thermally-conductive epoxy.

(39) The method of any one of (34) through (36), wherein the adhesive is tape.

(40) The method of any one of (34) through (39), wherein the particles comprise silica.

(41) The method of any one of (34) through (39), wherein the particles comprise a semiconductor.

(42) The method of any one of (34) through (39), wherein the particles comprise a metal.

(43) The method of any one of (34) through (39), wherein the particles comprise a ceramic.

(44) The method of any one of (34) through (43), wherein a maximum diameter of the particles is in a range from 0.5 micron to 1 millimeter.

(45) The method of any one of (34) through (44), wherein the particles are spherical.

(46) The method of (32) or (33), wherein applying the boiling enhancement coating comprises:
bonding a layer of metallic mesh or metallic wool to the surface.

(47) The method of (32) or (33), wherein applying the boiling enhancement coating comprises: bonding a first mesh layer to the surface; and bonding a second mesh layer to the first mesh layer, wherein the second mesh layer is coarser than the first mesh layer.

(48) A semiconductor die adapted for increased heat dissipation, the semiconductor die comprising: a surface to expose to a coolant liquid; and a boiling enhancement coating disposed on the surface.

(49) The semiconductor die of configuration (1), mounted on a printed circuit board in a package.

(50) The semiconductor die of configuration (1) or (49), wherein the boiling enhancement coating comprises: an adhesive contacting the surface; and particles bonded by the adhesive to the surface.

(51) The semiconductor die of configuration (50), wherein the adhesive has been etched to remove the adhesive from regions of the surface not covered by the particles.

(52) The semiconductor die of configuration (50) or (3), wherein the adhesive is an acrylic.

(53) The semiconductor die of configuration (50) or (3), wherein the adhesive is a thermally-conductive epoxy.

(54) The semiconductor die of configuration (50) or (3), wherein the adhesive is tape.

(55) The semiconductor die of any one of configurations (50) through (54), wherein the particles comprise silica.

(56) The semiconductor die of any one of configurations (50) through (54), wherein the particles comprise a semiconductor.

(57) The semiconductor die of any one of configurations (50) through (54), wherein the particles comprise a metal.

(58) The semiconductor die of any one of configurations (50) through (54), wherein the particles comprise a ceramic.

(59) The semiconductor die of any one of configurations (50) through (58), wherein a maximum diameter of the particles is in a range from 0.5 micron to 1 millimeter.

(60) The semiconductor die of any one of configurations (50) through (59), wherein the particles are spherical.

(61) The semiconductor die of configuration (1) or (2), wherein the boiling enhancement coating comprises a layer of metallic mesh or metallic wool bonded to the surface.

(62) The semiconductor die of configuration (1) or (2), wherein the boiling enhancement coating comprises: a first mesh layer bonded to the surface; and a second mesh layer bonded to the first mesh layer, wherein the second mesh layer is coarser than the first mesh layer.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that inventive embodiments may be practiced otherwise than as specifically described. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

Unless stated otherwise, the terms "approximately" and "about" are used to mean within ±20% of a target (e.g., dimension or orientation) in some embodiments, within ±10% of a target in some embodiments, within ±5% of a target in some embodiments, and yet within ±2% of a target in some embodiments. The terms "approximately" and "about" can include the target. The term "essentially" is used to mean within ±3% of a target.

The indefinite articles "a" and "an," as used herein, unless clearly indicated to the contrary, should be understood to mean "at least one."

The phrase "and/or," as used herein, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of" or "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of." "Consisting essentially of," shall have its ordinary meaning as used in the field of patent law.

As used herein, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A semiconductor die adapted for increased heat dissipation, the semiconductor die comprising:
    a surface to expose to a coolant liquid; and
    a boiling enhancement coating disposed on the surface, wherein the boiling enhancement coating comprises:
       an adhesive contacting the surface; and
       particles bonded by the adhesive to the surface, wherein the adhesive has been etched to remove the adhesive from regions of the surface not covered by the particles.

2. The semiconductor die of claim 1, mounted on a printed circuit board in a package.

3. The semiconductor die of claim 1, wherein the adhesive is an acrylic.

4. The semiconductor die of claim 1, wherein the adhesive is a thermally-conductive epoxy.

5. The semiconductor die of claim 1, wherein the adhesive is a tape.

6. The semiconductor die of claim 1, wherein the particles comprise silica.

7. The semiconductor die of claim 1, wherein the particles comprise a semiconductor.

8. The semiconductor die of claim 1, wherein the particles comprise a metal.

9. The semiconductor die of claim 1, wherein the particles comprise a ceramic.

10. The semiconductor die of claim 1, wherein a maximum diameter of the particles is in a range from 0.5 micron to 1 millimeter.

11. The semiconductor die of claim 1, wherein the particles are spherical.

12. A semiconductor die adapted for increased heat dissipation, the semiconductor die comprising:
    a surface to expose to a coolant liquid; and
    a boiling enhancement coating disposed on the surface, wherein the boiling enhancement coating comprises:
       a first layer comprising at least one of a first metallic mesh or first metallic wool bonded to the surface; and
       a second layer comprising at least one of a second metallic mesh or second metallic wool bonded to the first layer, wherein the second metallic mesh or the second metallic wool is coarser than the first metallic mesh or the first metallic wool.

13. A method comprising:
    applying a boiling enhancement coating to a surface of a semiconductor die, wherein applying the boiling enhancement coating to the surface comprises:
       applying an adhesive to the surface;
       applying particles to the adhesive; and
       exposing the surface to an etch to remove the adhesive from regions of the surface not covered by the particles.

14. The method of claim 13, wherein the semiconductor die is mounted on a printed circuit board in a package.

15. The method of claim 13, wherein applying the boiling enhancement coating comprises:
    mixing the particles with the adhesive to create a suspension containing the particles; and
    applying the suspension to the surface.

16. The method of claim 13, wherein the adhesive is an acrylic.

17. The method of claim 13, wherein the adhesive is a thermally-conductive epoxy.

18. The method of claim 13, wherein the adhesive is a tape.

19. The method of claim 13, wherein the particles comprise silica.

20. The method of claim 13, wherein the particles comprise a semiconductor.

21. The method of claim 13, wherein the particles comprise a metal.

22. The method of claim 13, wherein the particles comprise a ceramic.

23. The method of claim 13, wherein a maximum diameter of the particles is in a range from 0.5 micron to 1 millimeter.

24. The method of claim 13, wherein the particles are spherical.

\* \* \* \* \*